United States Patent
Weiser et al.

(10) Patent No.: US 8,361,678 B2
(45) Date of Patent: *Jan. 29, 2013

(54) SPECIAL POLYETHER-BASED POLYURETHANE FORMULATIONS FOR THE PRODUCTION OF HOLOGRAPHIC MEDIA

(75) Inventors: Marc-Stephan Weiser, Leverkusen (DE); Thomas Roelle, Leverkusen (DE); Friedrich-Karl Bruder, Krefeld (DE); Thomas Fäcke, Leverkusen (DE); Dennis Hönel, Zülpich (DE); Klaus Lorenz, Dormagen (DE); Jörg Hofmann, Krefeld (DE)

(73) Assignee: Bayer MaterialScience AG, Leverkusen (DE)

( * ) Notice: Subject to any disclaimer, the term of this patent is extended or adjusted under 35 U.S.C. 154(b) by 429 days.

This patent is subject to a terminal disclaimer.

(21) Appl. No.: 12/569,344

(22) Filed: Sep. 29, 2009

(65) Prior Publication Data

US 2010/0086861 A1    Apr. 8, 2010

(30) Foreign Application Priority Data

Oct. 1, 2008   (EP) .................................... 08017278

(51) Int. Cl.
*G03H 1/02* (2006.01)
*G11B 7/245* (2006.01)
*C08G 18/48* (2006.01)

(52) U.S. Cl. ........... 430/1; 430/2; 430/281.1; 430/280.1

(58) Field of Classification Search ....................... None
See application file for complete search history.

(56) References Cited

U.S. PATENT DOCUMENTS

| | | | |
|---|---|---|---|
| 5,470,813 | A |  11/1995 | Le-Khac |
| 6,743,552 | B2 | 6/2004 | Setthachayanon et al. |
| 6,765,061 | B2 | 7/2004 | Dhar et al. |
| 6,780,546 | B2 | 8/2004 | Trentler et al. |
| 7,008,900 | B1 | 3/2006 | Hofmann et al. |
| 2003/0044690 | A1 | 3/2003 | Rotto |
| 2007/0072124 | A1 | 3/2007 | Yamada |
| 2007/0077498 | A1 | 4/2007 | Yumoto et al. |
| 2007/0191567 | A1* | 8/2007 | Tsuge et al. ................. 528/44 |
| 2009/0062419 | A1* | 3/2009 | Stockel et al. ............. 522/109 |
| 2010/0087564 | A1* | 4/2010 | Weiser et al. ................ 522/95 |
| 2010/0112459 | A1* | 5/2010 | Weiser et al. ................. 430/2 |
| 2011/0189591 | A1* | 8/2011 | Weiser et al. ................. 430/2 |
| 2011/0236803 | A1* | 9/2011 | Weiser et al. ................. 430/2 |

FOREIGN PATENT DOCUMENTS

| | | |
|---|---|---|
| EP | 0223587 A1 | 5/1987 |
| EP | 0700949 A2 | 3/1996 |
| EP | 0743093 A1 | 11/1996 |
| EP | 0761708 B1 | 3/2003 |
| JP | 2007086234 A | 4/2007 |
| JP | 2007101743 A | 4/2007 |
| JP | 2007101881 A | 4/2007 |
| JP | 2007187968 A | 7/2007 |

(Continued)

*Primary Examiner* — Martin Angebranndt
(74) *Attorney, Agent, or Firm* — Connolly Bove Lodge & Hutz, LLP (57) ABSTRACT

The present invention relates to novel polyurethane compositions which are advantageous for the production of holographic media, inter alia for data storage, but also for optical applications of different types.

13 Claims, 2 Drawing Sheets

FOREIGN PATENT DOCUMENTS

| | | |
|---|---|---|
| JP | 2007272044 A | 10/2007 |
| JP | 2007279585 A | 10/2007 |
| JP | 2008015154 A | 1/2008 |
| JP | 2008070464 A | 3/2008 |
| WO | WO-97/40086 A1 | 10/1997 |
| WO | WO-98/16310 A1 | 4/1998 |
| WO | WO-00/47649 A1 | 8/2000 |
| WO | WO-2005/116756 A2 | 12/2005 |
| WO | WO-2008/029765 A1 | 3/2008 |
| WO | 2008/125199 * | 10/2008 |
| WO | WO-2008/125200 A1 | 10/2008 |

* cited by examiner

SPECIAL POLYETHER-BASED POLYURETHANE FORMULATIONS FOR THE PRODUCTION OF HOLOGRAPHIC MEDIA

RELATED APPLICATIONS

This application claims benefit to European Patent Application No. 08017278.6, filed Oct. 1, 2008, which is incorporated herein by reference in its entirety for all useful purposes.

BACKGROUND OF THE INVENTION

The present invention relates to novel polyurethane compositions which are advantageous for the production of holographic media, inter alia for data storage, but also for optical applications of different types.

In the structure of holographic media, as described in U.S. Pat. No. 6,743,552, information is stored in a polymer layer which substantially comprises a polymer matrix and very special polymerizable monomers present in uniform distribution therein. This matrix polymer may be polyurethane-based. It is prepared starting from isocyanate-functional materials which are crosslinked with polyols, such as polyethers or polyesters, with urethane formation.

U.S. Pat. Nos. 6,743,552, 6,765,061 and 6,780,546 disclose polyether-based PU matrices for use in holographic media, which are substantially based on trifunctional polypropylene oxides (PPO) and mixtures of poly(THF) with trifunctional PPO. Some of the formulations described there contain PPO having a low molar mass (Mn≦1000 g/mol) as a mixture with poly(THF), also having molar masses up to Mn≦1500 g/mol. A very similar approach is described in JP 2008015154 A 20080124. Here, the matrix was formed from difunctional isocyanates and mixtures of poly(THF) and trifunctional PPO. Likewise, US 2003044690 A1 20030306 describes the synthesis of a PU matrix from Desmodur® N 3400, Desmodur® N 3600 or Baytec WE-180 and a trifunctional PPO based on glycerol, having an Mn of 1000. In addition, in JP 2008070464 A 20080327, polyether-based PU matrices having relatively high Tg values (>30° C.) are used for holographic media. In WO 2008029765 A1 20080313, polyester- and polycarbonate-based polyols are used as components for polyurethane matrices for volume holograms and holographic media. WO 2005116756 A2 20051208 describes low-Tg polyurethane matrices based on a mixture of polyesters and Surfynol 440 (Air Products and Chemicals, Inc., Allentown, USA), a polyether with alkynediol starter for embossed holograms.

Furthermore, the patents JP 2007101743, JP 2007086234, JP 2007101881, US 20070077498 and US 20070072124 describe the use of di- and trifunctional polypropylene oxide in connection with PU matrices in the area of holographic data memories or as "volume-type holographic optical recording media". The isocyanate component used there was dicyclohexylmethane 4,4'-diisocyanate ("H12-MDI") or a prepolymer of the abovementioned components, in some cases in the presence of 1,4-butanediol as a chain extender. Analogous formulations are disclosed in the patents JP 2007187968 and JP 2007272044 for the area of "information recording and fixation" and "high density volume holographic recording material". The patent JP 2008070464 describes an analogous formulation as matrix material for holographic data memories and "holographic recording materials and recording media". In this case, polyethylene glycol having a number average molar mass (Mn) of 600 g/mol was used as a chain extender and, in addition to "H12-MDI", hexamethylene diisocyanate was also used. A trifunctional polypropylene oxide in combination with hexamethylene diisocyanate and/or Desmodur® N3300 was described in the patent JP 2007279585 as matrix material for the production of "holographic recording layers" and an "optical recording medium".

However, a disadvantage of the known polyurethane-based systems, in particular for optical applications outside digital data storage, is that the achievable brightness of the holograms stored in such media is too low. The reason for this is in general that the relative difference between the refractive indices of polyurethane matrix and writing monomer is too small. On the other hand, an arbitrary variation of the matrix polymer is not possible since good compatibility of the matrix polymer with writing monomer and the further components present in the formulations must always be ensured. Furthermore, for processing reasons, it is of interest to ensure that mixing and provision of the formulations are as simple as possible to carry out.

It was therefore an object of the invention to provide novel polyurethane compositions which permit a better contrast ratio and improved brightness of the holograms without sacrifices with respect to the compatibilities of matrix polymer and writing monomer.

It has now surprisingly been found that the abovementioned requirements can be met if special polyether polyols are used for synthesizing the matrix polymer.

EMBODIMENTS OF THE INVENTION

An embodiment of the present invention is a polyurethane composition comprising

A) a polyisocyanate component;
B) an isocyanate-reactive component comprising a hydroxy-functional multiblock copolymer B1) of the type $Y(X_i\text{—}H)_n$ having a number average molecular weight of greater than 1000 g/mol;
wherein
$X_i$ is an oxyalkylene units of formula (I):

—CH$_2$—CH(R)—O—   (I);

i is an integer from 1 to 10;
n is an integer from 2 to 8;
R is a hydrogen, alkyl, or aryl radical, wherein said alkyl or aryl radical is optionally substituted or interrupted by a heteroatom; and
Y is the fundamental initiator and the proportion of the segments $X_i$, based on the total amount of the segments $X_i$ and Y, accounts for at least 50% by weight;

C) a compound free of NCO groups which comprises a group that reacts under the action of actinic radiation with ethylenically unsaturated compounds via polymerization;
D) free radical stabilizers;
E) photoinitiators;
F) optionally catalysts; and
G) optionally auxiliaries and additives.

Another embodiment of the present invention is the above polyurethane composition, wherein A) comprises a polyisocyanate and/or a prepolymer based on HDI, TMDI, and/or TIN.

Another embodiment of the present invention is the above polyurethane composition, wherein A) comprises a polyisocyanate based on HDI with isocyanurate and/or iminooxadiazinedione structures or prepolymers having an NCO functionality of from 2 to 5 and exclusively primary NCO groups.

Another embodiment of the present invention is the above polyurethane composition, wherein A) has a residual content of free monomeric isocyanate of less than 0.5% by weight.

Another embodiment of the present invention is the above polyurethane composition, wherein at least one segment $X_i$ is a propylene oxide-based homopolymer or random or block copolymer comprising oxyethylene, oxypropylene and/or oxybutylene units, wherein the proportion of said oxypropylene units, based on the total amount of all oxyethylene, oxypropylene, and oxybutylene units, accounts for at least 20% by weight.

Another embodiment of the present invention is the above polyurethane composition, wherein said starter segment Y is based on a difunctional, aliphatic polycarbonate polyol, poly(ε-caprolactone), or polymer of tetrahydrofuran having a number average molar mass greater than 250 g/mol and less than 2100 g/mol.

Another embodiment of the present invention is the above polyurethane composition, wherein said multiblock copolymers B1) has a number average molecular weight of from 1200 to 12 000 g/mol.

Another embodiment of the present invention is the above polyurethane composition, wherein said compound of C) has a refractive index $n_D^{20}$ of greater than 1.55.

Another embodiment of the present invention is the above polyurethane composition, wherein C) comprises a urethane acrylate and/or a urethane methacrylate based on an aromatic isocyanate and 2-hydroxyethyl acrylate, hydroxypropyl acrylate, 4-hydroxybutyl acrylate, polyethylene oxide mono(meth)acrylate, polypropylene oxide mono(meth)acrylate, polyalkylene oxide mono(meth)acrylate, and/or a poly(ε-caprolactone) mono(meth)acrylate.

Yet another embodiment of the present invention is a process for producing media for recording visual holograms comprising (1) applying the above polyurethane composition to a substrate or in a mould and (2) curing said polyurethane composition.

Yet another embodiment of the present invention is a medium for recording visual holograms produced by the above process.

Yet another embodiment of the present invention is an optical element or image comprising the above medium.

Yet another embodiment of the present invention is a method for recording a hologram comprising exposing the above medium.

DESCRIPTION OF THE INVENTION

The invention therefore relates to polyurethane compositions comprising
A) a polyisocyanate component,
B) an isocyanate-reactive component comprising hydroxy-functional multiblock copolymers B1) of the type $Y(X_i\text{—H})_n$ with i=1 to 10 and n=2 to 8 and number average molecular weights greater than 1000 g/mol, the segments $X_i$ being composed in each case of oxyalkylene units of the formula (I), formula (I)

in which
R is a hydrogen, alkyl or aryl radical which may also be substituted or may be interrupted by heteroatoms (such as ether oxygens)
Y is the fundamental initiator
and the proportion of the segments $X_i$, based on the total amount of the segments $X_i$ and Y, accounts for at least 50% by weight,
C) compounds which have groups reacting under the action of actinic radiation with ethylenically unsaturated compounds with polymerization (radiation-curing groups) and are themselves free of NCO groups,
D) free radical stabilizers
E) photoinitiators
F) optionally catalysts
G) optionally auxiliaries and additives.

Typical polyurethane compositions comprise:
5 to 93.999% by weight of the components B) according to the invention,
1 to 60% by weight of component A),
5 to 70% by weight of the component C),
0.001 to 10% by weight of photoinitiators E),
0 to 10% by weight of free radical stabilizers D),
0 to 4% by weight of catalysts F),
0 to 70% by weight of auxiliaries and additives G).

Preferably, the polyurethane compositions according to the invention comprise
15 to 82.989% by weight of the components B) according to the invention,
2 to 40% by weight of component A),
15 to 70% by weight of the component C),
0.01 to 7.5% by weight of photoinitiators E),
0.001 to 2% by weight of free radical stabilizers D),
0 to 3% by weight of catalysts F),
0 to 50% by weight of auxiliaries and additives G).

Particularly preferably, the polyurethane compositions according to the invention comprise
15 to 82.489% by weight of the components B) according to the invention,
2 to 40% by weight of component A),
15 to 50% by weight of the component C),
0.5 to 5% by weight of photoinitiators E),
0.01 to 0.5% by weight of free radical stabilizers D),
0.001 to 2% by weight of catalysts F),
0 to 35% by weight of auxiliaries and additives G).

Suitable compounds of the polyisocyanate component A) are all aliphatic, cycloaliphatic, aromatic or araliphatic di- and triisocyanates known per se to the person skilled in the art, it being unimportant whether they were obtained by means of phosgenation or by phosgene-free processes. In addition, the relatively high molecular weight secondary products (oligo- and polyisocyanates) of monomeric di- and/or triisocyanates having a urethane, urea, carbodiimide, acylurea, isocyanurate, allophanate, biuret, oxadiazinetrione, uretdione or iminooxadiazinedione structure, which secondary products are well known per se to the person skilled in the art, can also be used in each case individually or in any mixtures with one another.

For example, suitable monomeric di- or triisocyanates are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

Also possible is the use of isocyanate-functional prepolymers having urethane, allophanate or biuret structures as compounds of component A), as can be obtained in a manner known well per se by reacting the abovementioned di-, tri- or polyisocyanates in excess with hydroxy- or amino-functional compounds. Any unreacted starting isocyanate can then be removed in order to obtain low-monomer products. For accelerating the prepolymer formation, use of catalysts well known to the person skilled in the art per se from polyurethane chemistry may be helpful.

Suitable hydroxy- or aminofunctional compounds for the prepolymer synthesis are typically low molecular weight short-chain, aliphatic, araliphatic or cycloaliphatic diols, triols and/or higher polyols, i.e. containing 2 to 20 carbon atoms.

Examples of diols are ethylene glycol, diethylene glycol, triethylene glycol, tetraethylene glycol, dipropylene glycol, tripropylene glycol, 1,2-propanediol, 1,3-propanediol, 1,4-butanediol, neopentylglycol, 2-ethyl-2-butylpropanediol, trimethylpentanediol, diethyloctanediol positional isomers, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl dimethyl-3-hydroxypropionate.

Examples of suitable triols are trimethylolethane, trimethylolpropane or glycerol. Suitable higher-functional alcohols are ditrimethylolpropane, pentaerythritol, dipentaerythritol or sorbitol.

Relatively high molecular weight aliphatic and cycloaliphatic polyols, such as polyester polyols, polyether polyols, polycarbonate polyols, hydroxy-functional acrylic resins, hydroxy-functional polyurethanes, hydroxy-functional epoxy resins or corresponding hybrids (cf. Römpp Lexikon Chemie [Römpp Chemistry Lexicon], pages 465-466, 10th edition 1998, Georg-Thieme-Verlag, Stuttgart) are also suitable.

Polyesterpolyols suitable for the prepolymer synthesis are linear polyester diols, as can be prepared in a known manner from aliphatic, cycloaliphatic or aromatic di- or polycarboxylic acids or their anhydrides, such as, for example, succinic, glutaric, adipic, pimelic, suberic, azelaic, sebacic nonanedicarboxylic, decanedicarboxylic, terephthalic, isophthalic, o-phthalic, tetrahydrophthalic, hexahydrophthalic or trimellitic acid, and acid anhydrides, such as o-phthalic, trimellitic or succinic anhydride, or a mixture thereof with polyhydric alcohols, such as, for example, ethanediol, di-, tri- or tetraethylene glycol, 1,2-propanediol, di-, tri-, or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof, optionally with concomitant use of higher functional polyols, such as trimethylolpropane or glycerol. Of course, cycloaliphatic and/or aromatic di- and polyhydroxy compounds are also suitable as polyhydric alcohols for the preparation of the polyester polyols. Instead of the free polycarboxylic acid, it is also possible to use the corresponding polycarboxylic anhydrides or corresponding polycarboxylates of lower alcohols or mixtures thereof for the preparation of the polyesters.

Polyester polyols also suitable for the prepolymer synthesis are homo- or copolymers of lactones, which are preferably obtained by an addition reaction of lactones or lactone mixtures, such as butyrolactone, ε-caprolactone and/or methyl-ε-caprolactone, with suitable difunctional and/or higher-functional initiator molecules, such as, for example, the low molecular weight polyhydric alcohols mentioned above as synthesis components for polyester polyols.

Polycarbonates having hydroxyl groups are also suitable as a polyhydroxy component for the prepolymer synthesis, for example those which can be prepared by reaction of diols, such as 1,4-butanediol and/or 1,6-hexanediol and/or 3-methylpentanediol, with diaryl carbonates, e.g. diphenyl carbonate, dimethyl carbonate or phosgene.

Polyether polyols suitable for the prepolymer synthesis are, for example, the polyaddition products of styrene oxides, of ethylene oxide, propylene oxide, tetrahydrofuran, butylene oxide, epichlorohydrin and their mixed adducts and graft products, and the polyether polyols obtained by condensation of polyhydric alcohols or mixtures thereof and those obtained by alkoxylation of polyhydric alcohols, amines and amino alcohols. Preferred polyether polyols are poly(propylene oxides), poly(ethylene oxides) and combinations thereof in the form of random or block copolymers or poly(tetrahydrofurans) and mixtures thereof having an OH functionality of 1.5 to 6 and a number average molecular weight between 200 and 18000 g/mol, preferably having an OH functionality of 1.8 to 4.0 and a number average molecular weight of 600 to 8000 g/mol and particularly preferably having an OH functionality of 1.9 to 3.1 and a number average molecular weight of 650 to 4500 g/mol.

Suitable amines for the prepolymer synthesis are all oligomeric or polymeric, primary or secondary, di-, tri- or polyfunctional amines. For example, these may be: ethylenediamine, diethylenetriamine, triethylenetetramine, propylenediamine, diaminocyclohexane, diaminobenzene, diaminobisphenyl, triaminobenzene, difunctional, trifunctional and higher-functional polyamines, such as, for example, the Jeffamines®, amine-terminated polymers having number average molar masses up to 10 000 g/mol or any mixtures thereof with one another.

Preferred prepolymers are those based on the abovementioned synthesis components having urethane and/or allophanate groups with number average molecular weights of 200 to 10 000 g/mol, preferably with number average molecular weights of 500 to 8000 g/mol. Particularly preferred prepolymers are allophanates based on HDI or TMDI and di- or trifunctional polyether polyols having number average molar masses of 1000 to 8000 g/mol.

It is, if appropriate, also possible for the isocyanate component A to contain proportionate amounts of isocyanates which are partly reacted with isocyanate-reactive ethylenically unsaturated compounds. α,β-Unsaturated carboxylic acid derivatives, such as acrylates, methacrylates, maleates, fumarates, maleimides, acrylamides, and vinyl ether, propenyl ether, allyl ether and compounds which contain dicyclopentadienyl units having at least one group reactive towards isocyanates are preferably used here as isocyanate-reactive ethylenically unsaturated compounds. Acrylates and methacrylates having at least one isocyanate-reactive group are particularly preferred. Suitable hydroxy-functional acrylates or methacrylates are, for example, compounds such as 2-hydroxyethyl(meth)acrylate, polyethylene oxide mono(meth)acrylates, polypropylene oxide mono(meth)acrylates, polyalkylene oxide mono(meth)acrylates, poly(ε-caprolactone) mono(meth)acrylates, such as, for example, Tone® M100 (Dow, USA), 2-hydroxypropyl(meth)acrylate, 4-hydroxybutyl(meth)acrylate, 3-hydroxy-2,2-dimethylpropyl(meth)acrylate, the hydroxy-functional mono-, di- or tetra(meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol and the industrial mixtures thereof. In addition, isocyanate-reactive oligmeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component A, is 0 to 99%, preferably 0 to 50%, particularly preferably 0 to 25% and very particularly preferably 0 to 15%.

The NCO groups of the polyisocyanates of the component A) can also be completely or partly blocked with the blocking agents customary in industry. These are, for example, alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, acetoacetates, acetone oxime, 3,5-dimethylpyrazole, ε-caprolactam, N-tert-butylbenzylamine, cyclopentanonecarboxyethyl ester or any mixtures of these blocking agents.

Polyisocyanates and/or prepolymers of the abovementioned type based on HDI, TMDI and/or TIN are preferably used in A).

Polyisocyanates based on HDI with isocyanurate and/or iminooxadiazinedione structures are particularly preferably used.

The use of prepolymers, preferably having NCO functionalities of 2 to 5, particularly preferably those having primary NCO groups, is likewise particularly preferred. Examples of such prepolymers are allophanates or urethanes or mixtures thereof, preferably based on HDI and/or TMDI, and polyether- and/or polyester- or polycarbonate polyols.

The abovementioned polyisocyanates or prepolymers preferably have residual contents of free monomeric isocyanate of less than 1% by weight, particularly preferably less than 0.5% by weight, very particularly preferably less than 0.2% by weight.

The isocyanate-reactive component B1) has a multiblock copolymer structure which satisfies the formula $Y(X_i\text{—H})_n$.

The outer blocks $X_i$ account for at least 50% by weight, preferably 66% by weight, of the total molar mass of $Y(X_i\text{—H})_n$ and consist of monomer units which obey the formula (I). Preferably, n in $Y(X_i\text{—H})_n$ is a number from 2 to 6, particularly preferably 2 or 3 and very particularly preferably 2. Preferably, i in $Y(X_i\text{—H})_n$ is a number from 1 to 6, particularly preferably from 1 to 3 and very particularly preferably 1.

In formula (I), R is preferably a hydrogen, a methyl, butyl, hexyl or octyl group or an alkyl radical containing ether group. Preferred alkyl radicals containing ether groups are those based on oxyalkylene units, the number of repeating units preferably being 1 to 50.

The multiblock copolymers $Y(X_i\text{—H})_n$ preferably have number average molecular weights of more than 1200 g/mol, particularly preferably more than 1950 g/mol, but preferably not more than 12 000 g/mol, particularly preferably not more than 9000 g/mol.

The blocks $X_i$ may be homopolymers comprising exclusively identical oxyalkylene repeating units. They may also be randomly composed of different oxyalkylene units or in turn composed of blocks of different oxyalkylene units.

Preferably, the segments $X_i$ are based exclusively on propylene oxide or random or blockwise mixtures of propylene oxide with further 1-alkylene oxides, the proportion of further 1-alkylene oxides being not higher than 80% by weight.

Propylene oxide homopolymers and random or block copolymers which oxyethylene, oxypropylene and/or oxybutylene units are particularly preferred as segments $X_i$, the proportion of the oxypropylene units, based on the total amount of all oxyethylene, oxypropylene and oxybutylene units, accounting for at least 20% by weight, preferably at least 45% by weight.

The blocks $X_i$ are added, as described further below, to an n-fold hydroxy- or aminofunctional starter block $Y(H)_n$ by ring-opening polymerization of the alkylene oxides described above.

The inner block Y, which is present in an amount of less than 50% by weight, preferably of less than 34% by weight, in $Y(X_i\text{—H})_n$, consists of di- and/or higher-hydroxy-functional polymer structures based on cyclic ethers or is composed of di- and/or higher-hydroxy-functional polycarbonate, polyester, poly(meth)acrylate, epoxy resin and/or polyurethane structural units or corresponding hybrids.

Suitable polyester polyols are linear polyesterdiols or branched polyesterpolyols, as can be prepared in a known manner from aliphatic, cycloaliphatic or aromatic di- or polycarboxylic acids or their anhydrides, such as, for example, succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid, and acid anhydrides, such as o-phthalic, trimellitic or succinic anhydride, or any mixtures thereof with polyhydric alcohols, such as, for example, ethanediol, di-, tri- or tetraethylene glycol, 1,2-propanediol, di-, tri-, or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof, optionally with the concomitant use of higher-functional polyols, such as trimethylolpropane or glycerol. Suitable polyhydric alcohols for the preparation of the polyester polyols are of course also cycloaliphatic and/or aromatic di- and polyhydroxy compounds. Instead of the free polycarboxylic acid, it is also possible to use the corresponding polycarboxylic anhydrides or corresponding polycarboxylic esters of lower alcohols or mixtures thereof for the preparation of the polyesters.

The polyester polyols may also be based on natural raw materials, such as castor oil. It is also possible for the polyester polyols to be based on mono- or copolymers of lactones, as can preferably be obtained by an addition reaction of lactones or lactone mixtures, such as butyrolactone, ε-caprolactone and/or methyl-ε-caprolactone, with hydroxy-functional compounds, such as polyhydric alcohols having an OH functionality of preferably 2, for example the abovementioned type.

Such polyester polyols preferably have number average molar masses of 200 to 2000 g/mol, particularly preferably of 400 to 1400 g/mol.

Suitable polycarbonate polyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned per se in connection with the polyester polyols and having an OH functionality of 2, preferably 1,4-butanediol, 1,6-hexanediol and/or 3-methylpentanediol. Polyester polyols can also be converted into polycarbonate polyols.

Such polycarbonate polyols preferably have number average molar masses of 400 to 2000 g/mol, particularly preferably of 500 to 1400 g/mol and very particularly preferably of 650 to 1000 g/mol.

Suitable polyether polyols are optionally polyadducts of cyclic ethers with OH— or NH-functional initiator molecules, which polyadducts have a block composition. For example, the polyadducts of styrene oxides, of ethylene oxide, propylene oxide, tetrahydrofuran, butylene oxide, epichlorhydrin and their mixed adducts and graft products and the polyether polyols obtained by condensation of polyhydric alcohols or mixtures thereof and those obtained by alkoxylation of polyhydric alcohols, amines and aminoalcohols may be as polyether polyols.

Suitable polymers of cyclic ethers are in particular polymers of tetrahydrofuran.

Initiators which may be used are the polyhydric alcohols mentioned per se in connection with the polyester polyols and primary or secondary amines and amino alcohols having an OH or NH functionality of 2 to 8, preferably 2 to 6, particularly preferably 2 or 3, very particularly preferably 2.

Such polyether polyols preferably have number average molar masses of 200 to 2000 g/mol, particularly preferably of 400 to 1400 g/mol and very particularly preferably of 650 to 1000 g/mol.

Of course, mixtures of the components described above can also be used for the inner block Y.

Preferred components for the inner block Y are polymers of tetrahydrofuran and aliphatic polycarbonate polyols and polyester polyols and polymers of ε-caprolactone having number average molar masses of less than 3100 g/mol.

Particularly preferred components for the inner block Y are difunctional polymers of tetrahydrofuran and difunctional aliphatic polycarbonate polyols and polyester polyols and polymers of ε-caprolactone having number average molar masses of less than 3100 g/mol.

Very particularly preferably, the starter segment Y is based on difunctional, aliphatic polycarbonate polyols, poly(ε-caprolactone) or polymers of tetrahydrofuran having number average molar masses greater than 250 g/mol and less than 2100 g/mol.

Preferably used block copolymers having the structure $Y(X_i—H)_n$ comprise more than 50% by weight of the blocks $X_i$ described above as being according to the invention and have a total number average molar mass greater than 1200 g/mol.

Particularly preferred block copolymers comprise less than 50% by weight of aliphatic polyester, aliphatic polycarbonate polyol or poly-THF and more than 50% by weight of the blocks $X_i$ described above as being according to the invention and have a number average molar mass greater than 1200 g/mol. Particularly preferred block copolymers comprise comprise less than 50% by weight of aliphatic polycarbonate polyol, poly(ε-caprolactone) or poly-THF and more than 50% by weight of the blocks $X_i$ described above as being according to the invention and have a number average molar mass greater than 1200 g/mol.

Very particularly preferred block copolymers comprise less than 34% by weight of aliphatic polycarbonate polyol, poly(ε-caprolactone) or poly-THF and more than 66% by weight of the blocks $X_i$ described above as being according to the invention and have a number average molar mass greater than 1950 g/mol and less than 9000 g/mol.

The block copolymers according to the invention are prepared by alkylene oxide addition processes. Of industrial importance is firstly the base-catalysed addition reaction of alkylene oxides with initiator compounds having Zerewitinoff-active hydrogen atoms $Y(H)_n$; secondly, the use of double metal cyanide compounds ("DMC catalysts") is becoming increasingly important for carrying out this reaction. Hydrogen bonded to N, O or S is designated as Zerewitinoff-active hydrogen (sometimes also only as "active hydrogen") if it gives methane by reaction with methylmagnesium iodide by a process discovered by Zerewitinoff. Typical examples of compounds having a Zerewitinoff-active hydrogen are compounds which contain carboxyl, hydroxyl, amino, imino or thiol groups as functional groups. The base-catalysed addition reaction of alkylene oxides, such as, for example, ethylene oxide or propylene oxide, with initiator compounds having Zerewitinoff-active hydrogen atoms is effected in the presence of alkali metal hydroxides, but it is also possible to use alkali metal hydrides, alkali metal carboxylates or alkaline earth metal hydroxides. After the addition reaction of the alkylene oxides is complete, the polymerization-active centres on the polyether chains must be deactivated, for example by neutralizing with dilute mineral acids, such as sulphuric acid or phosphoric acid, and separating off the resulting salts. In the process according to the invention, DMC catalysts are preferably used. Highly active DMC catalysts which are described, for example, in U.S. Pat. No. 5,470,813, EP-A 700 949, EP-A 743 093, EP-A 761 708, WO 97/40086, WO 98/16310 and WO 00/47649 are particularly preferably used. The highly active DMC catalysts which are described in EP-A 700 949 and, in addition to a double metal cyanide compound (e.g. zinc hexacyanocobaltate(III)) and an organic complex ligand (e.g. tert-butanol), also contain a polyether having a number average molecular weight greater than 500 g/mol are are a typical example. Owing to their high activity, these catalysts can be used in such small amounts that further work-up of the polyether polyols is not required. The process is described in detail below. The "initiator polyol" used is always the OH— functionalized precursor Y which is present in an amount of less than 50% by weight in the block copolymer and onto which alkylene oxide is polymerized so that at the end a multiblock copolymer is obtained. Preferably obtained alkylene oxides are ethylene oxide, propylene oxide, butylene oxide and mixtures thereof. The synthesis of the polyether chains by alkoxylation can be carried out, for example, only with one monomeric epoxide or randomly or blockwise with a plurality of different monomeric epoxides.

As further constituents of the isocyanate-reactive component B), all OH— and/or NH— functional compounds known to the person skilled in the art can be used as B2). These are in particular di- and higher-functional polyether polyols, the monomers of which do not obey the formula (I), such as polyester polyols, polycarbonate polyols, homo- or copolymers of lactones, hydroxy- or aminefunctional polyacrylic resins and polyamines, such as, for example, the Jeffamines® or other amine-terminated polymers and (block) copolymers or mixtures thereof.

If mixtures of B1) and B2) are used in B), preferably at least 80% by weight of B1) and not more than 20% by weight of B2), particularly preferably at least 99% by weight of B1) and not more than 1% by weight of B2) and very particularly preferably 100% by weight of B1) are used.

Preferably, compounds having a refractive index $n_D^{20} > 1.55$, particularly preferably >1.58, are used in C).

In component C), compounds such as α,β-unsaturated carboxylic acid derivatives, such as acrylates, methacrylates, maleates, fumarates, maleimides, acrylamides, and furthermore vinyl ether, propenyl ether, allyl ether and compounds containing dicyclopentadienyl units and olefinically unsaturated compounds, such as, for example, styrene, α-methylstyrene, vinyltoluene, olefins, such as, for example, 1-octene and/or 1-decene, vinyl esters, (meth)acrylonitrile, (meth) acrylamide, methacrylic acid and acrylic acid can be used. Acrylates and methacrylates are preferred.

In general, esters of acrylic acid or methacrylic acid are designated as acrylates or methacrylates. Examples of acrylates and methacrylates which can be used are methyl acrylate, methyl methacrylate, ethyl acrylate, ethyl methacrylate, ethoxyethyl acrylate, ethoxyethyl methacrylate, n-butyl acrylat, n-butyl methacrylate, tert-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylat, p-chlorophenyl methacrylate, p-bromophenyl acrylat, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, 2-naphthyl acrylate, 2-naphthyl methacrylate, 1,4-bis(2-thionaphthyl)2-butyl acrylate, 1,4-bis(2-thionaphthyl)-2-butyl methacrylate, propane-2,2-diylbis[(2,6-dibromo-4,1-phenylene)oxy(2-{[3,3,3-tris(4-chlorophenyl)propanoyl]oxy}propane-3,1-diyl)oxyethane-2,1-diyl]diacrylate, bisphenol A diacrylate, bisphenol A dimethacrylate, tetrabromobisphenol A diacrylate, tetrabromobisphenol A dimethacrylate and the ethoxylated analogue compounds thereof, N-carbazolyl acrylates, to mention only a selection of acrylates and methacrylates which can be used.

Of course, urethane acrylates can also be used as component C). Urethane acrylates are understood as meaning compounds having at least one acrylic ester group which additionally have at least one urethane bond. It is known that such compounds can be obtained by reacting a hydroxy-functional acrylate with an isocyanate-functional compound.

Examples of isocyanates which can be used for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis (4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, triphenylmethane 4,4', 4''-triisocyanate and tris(p-isocyanatophenyl)thiophosphate or derivatives thereof having a urethane, urea, carbodiimide, acylurea, isocyanurate, allophanate, biuret, oxadiazinetrione, uretdione or iminooxadiazinedione structure and mixtures thereof. Aromatic or araliphatic di-, tri- or polyisocyanates are preferred.

Suitable hydroxyfunctional acrylates or methacrylates for the preparation of urethane acrylates are, for example, compounds such as 2-hydroxyethyl(meth)acrylate, polyethylene oxide mono(meth)acrylates, polypropylene oxide mono (meth)acrylates, polyalkylene oxide mono(meth)acrylates, poly($\epsilon$-caprolactone) mono(meth)acrylates, such as, for example, Tone® M100 (Dow, Schwalbach, Germany), 2-hydroxypropyl (meth)acrylate, 4-hydroxybutyl(meth)acrylate, 3-hydroxy-2,2-dimethylpropyl (meth)acrylate, hydroxypropyl(meth)acrylate, 2-hydroxy-3-phenoxypropyl acrylate, the hydroxyfunctional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof 2-Hydroxyethyl acrylate, hydroxypropyl acrylate, 4-hydroxybutyl acrylate and poly($\epsilon$-caprolactone) mono(meth)acrylates are preferred. In addition, as isocyanate-reactive oligomeric or polymeric unsaturated compounds containing acrylate and/or methacrylate groups, alone or in combination with the abovementioned monomeric compounds, are suitable. It is also possible to use the epoxy(meth)acrylates known per se, containing hydroxyl groups and having OH contents of 20 to 300 mg KOH/g or polyurethane (meth)acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates. Epoxyacrylates containing hydroxyl groups and having a defined hydroxy functionality are preferred. Epoxy(meth)acrylates containing hydroxyl groups are based in particular on reaction products of acrylic acid and/or methacrylic acid with epoxides (glycidyl compounds) of monomeric, oligomeric or polymeric bisphenol A, bisphenol F, hexanediol and/or butanediol or the ethoxylated and/or propoxylated derivatives thereof. Epoxyacrylates having a defined functionality, as can be obtained from the known reaction of acrylic acid and/or methacrylic acid and glycidyl (meth)acrylate, are furthermore preferred.

(Meth)acrytes and/or urethane (meth)acrylates are preferably used, particularly preferably (meth)acrylates and/or urethane (meth)acrylates which have at least one aromatic structural unit.

Compounds particularly preferably to be used as component C are urethane acrylates and urethane methacrylates based on aromatic isocyanates and 2-hydroxyethyl acrylate, hydroxypropyl acrylate, 4-hydroxybutyl acrylate, polyethylene oxide mono(meth)acrylate, polypropylene oxide mono (meth)acrylate, polyalkylene oxide mono(meth)acrylate and poly($\epsilon$-caprolactone) mono(meth)acrylates.

In a very particularly preferred embodiment, the adducts of aromatic triisocyanates (very particularly preferably tris(4-phenylisocyanato) thiophosphate or trimers of aromatic diisocyanates, such as toluene diisocyanate) with hydroxyethyl acrylate, hydroxypropyl acrylate, 4-hydroxybutyl acrylate are used as component C. In a further very particularly preferred embodiment, adducts of 3-thiomethylphenyl isocyanate with hydroxyethyl acrylate, hydroxypropyl acrylate or 4-hydroxybutyl acrylate are used as component C.

Examples of vinylaromatics are styrene, halogenated derivatives of styrene, such as, for example, 2-chlorostyrene, 3-chlorostyrene, 4-chlorostyrene, 2-bromostyrene, 3-bromostyrene, 4-bromostyrene, p-(chloromethyl)styrene, p-(bromomethyl)styrene or 1-vinylnaphthalene, 2-vinylnaphthalene, 2-vinylanthracene, 9-vinylanthracene, 9-vinylcarbazole or difunctional compounds, such as divinylbenzene.

Suitable compounds of component D) are, for example, inhibitors and antioxidants, as described, for example, in "Methoden der organischen Chemie [Methods of Organic Chemistry]" (Houben-Weyl), 4th edition, volume XIV/1, page 433 et seq., Georg Thieme Verlag, Stuttgart 1961. Suitable classes of substances are, for example, phenols, such as, for example, 2,6-di-tert-butyl-4-methylphenol, cresols, hydroquinones, benzyl alcohols, such as, for example, benzhydrol, optionally also quinones, such as, for example, 2,5-di-tert-butylquinone, optionally also aromatic amines, such as diisopropylamine or phenothiazine.

2,6-Di-tert-butyl-4-methylphenol, phenothiazine, p-methoxyphenol, 2-methoxy-p-hydroquinone and benzhydrol are preferred One or more photoinitiators are used as component E). These are usually initiators which can be activated by actinic radiation and initiate polymerization of the corresponding polymerizable groups. Photoinitiators are commercially sold compounds known per se, a distinction being made between monomolecular (type I) and bimolecular (type II) initiators. Furthermore, depending on the chemical nature, these initiators are used for the free radical, the anionic (or), the cationic (or mixed) forms of the above-mentioned polymerizations.

(Type I) systems for free radical photopolymerization are, for example, aromatic ketone compounds, e.g. benzophenones, in combination with tertiary amines, alkylbenzophenones, 4,4'-bis(dimethylamino)benzophenone (Michler's ketone), anthrone and halogenated benzophenones or mixtures of said types. (Type II) initiators, such as benzoin and its derivatives, benzil ketals, acylphosphine oxides, e.g. 2,4,6-trimethylbenzoyldiphenylphosphine oxide, bisacylophosphine oxide, phenylglyoxylic esters, camphorquinone, alpha-aminoalkylphenone, alpha,alpha-dialkoxyacetophenone, 1-[4-(phenylthio)phenyl]octane-1,2-dione 2-(O-benzoyloxime) and alpha-hydroxyalkylphenone are furthermore suitable. The photoinitiator systems described in EP-A 0223587 and consisting of a mixture of an ammonium arylborate and one or more dyes can also be used as a photoinitiator. For example, tetrabutylammonium triphenylhexylborate, tetrabutylammonium tris-(3-fluorophenyl)hexylborate and tetrabutylammonium tris(3-chloro-4-methylphenyl)hexylborate are suitable as ammonium arylborate. Suitable dyes are, for example, new methylene blue, thionine, basic yellow, pinacynol chloride, rhodamine 6G, gallocyanine, ethyl violet, Victoria Blue R, Celestine Blue, quinaldine red, crystal violet, brilliant green, Astrazon Orange G, Darrow Red, pyronine Y, Basic Red 29, pyrillium I, cyanine and methylene blue, Azure A (Cunningham et al., RadTech '98 North America UV/EB Conference Proceedings, Chicago, Apr. 19-22, 1998).

The photoinitiators used for the anionic polymerization are as a rule (type I) systems and are derived from transition metal complexes of the first row. Chromium salts, such as, for example, trans-$Cr(NH_3)_2(NCS)_4$— (Kutal et al., Macromolecules 1991, 24, 6872) or ferrocenyl compounds (Yamaguchi et al., Macromolecules 2000, 33, 1152) are known here. A further possibility of the anionic polymerization consists in the use of dyes, such as crystal violet leukonitrile or malachite green leukonitrile, which can polymerize cyanoacrylates by photolytic decomposition (Neckers et al. Macromolecules 2000, 33, 7761). However, the chromophore is incorporated into the polymer so that the resulting polymers are coloured through.

The photoinitiators used for the cationic polymerization substantially comprise three classes: aryldiazonium salts, onium salts (here in particular: iodonium, sulphonium and selenonium salts) and organometallic compounds. Under irradiation, both in the presence and the absence of a hydrogen donor, phenyldiazonium salts can produced a cation that initiates the polymerization. The efficiency of the total system is determined by the nature of the counterion used for the diazonium compound. Here, the slightly reactive but very expensive $SbF_6^-$, $AsF_6^-$ or $PF_6^-$ is preferred. For use in coating thin films, these compounds are as a rule not very suitable since the surface quality is reduced (pinholes) by the nitrogen liberated after the exposure to light (Li et al., Polymeric Materials Science and Engineering, 2001, 84, 139). Very widely used and also commercially available in all kinds of forms are onium salts, especially sulphonium and iodonium salts. The photochemistry of these compounds has long been investigated. The iodonium salts first decompose homolytically after excitation and thus produce a free radical and free radical cation which is stabilized by H abstraction, liberates a proton and then initiates the cationic polymerization (Dektar et al., J. Org. Chem. 1990, 55, 639; J. Org. Chem., 1991, 56, 1838). This mechanism enables the use of iodonium salts also for free radical photopolymerization. The choice of the counterion is once again of considerable importance here; very expensive $SbF_6^-$, $AsF_6^-$ or $PF_6^-$ are likewise preferred. Otherwise, in this structure class, the choice of the substitution of the aromatic is completely free and is substantially determined by the availability of suitable starting building blocks for the synthesis. The sulphonium salts are compounds which decompose according to Norrish(II) (Crivello et al., Macromolecules, 2000, 33, 825). In the case of the sulphonium salts, too, the choice of the counterion is of critical importance, which manifests itself substantially in the curing rate of the polymers. The best results are obtained as a rule with $SbF_6^-$ salts. Since the self-absorption of iodonium and sulphonium salts is <300 nm, these compounds must be appropriately sensitized for the photopolymerization with near UV or shortwave visible light. This is possible by the use of aromatics having a higher absorption, such as, for example, anthracene and derivatives (Gu et al., Am. Chem. Soc. Polymer Preprints, 2000, 41 (2), 1266) or phenothiazine or derivatives thereof (Hua et al, Macromolecules 2001, 34, 2488-2494).

It may be advantageous also to use mixtures of these compounds. Depending on the radiation source used for the curing, the type and concentration of photoinitiator must be adapted in a manner known to the person skilled in the art. The above-mentioned adjustment with regard to the photopolymerization is easily possible for a person skilled in the art in the form of routine experiments within the below-mentioned quantity ranges of the components and the respectively available, in particular the preferred synthesis components.

Preferred photoinitiators E) are mixtures of tetrabutylammonium tetrahexylborate, tetrabutylammonium triphenylhexylborate, tetrabutylammonium tris(3-fluorophenyl)hexylborate and tetrabutylammonium tris(3-chloro-4-methylphenyl)hexylborate with dyes, such as, for example, Astrazon Orange G, methylene blue, new methylene blue, azure A, pyrillium I, safranine O, cyanine, gallocyanine, brilliant green, crystal violet, ethyl violet and thionine.

Optionally, one or more catalysts may be used as compounds of component F). These are catalysts for accelerating the urethane formation. Known catalysts for this purpose are, for example, tin octanoate, zinc octanoate, dibutyltin dilaurate, dimethylbis[(1-oxoneodecyl)oxy]stannane, dimethyltin dicarboxylate, zirconium bis(ethylhexanoate), zirconium aceylacetonate or tertiary amines, such as, for example, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido(1,2-a)pyrimidine.

Dibutyltin dilaurate, dimethylbis[(1-oxoneodecyl)oxy] stannane, dimethyltin dicarboxylate, 1,4-diazabicyclo[2.2.2] octane, diazabicyclononane, diazabicycloundecane, 1,1,3,3-tetramethylguanidine, 1,3,4,6,7,8-hexahydro-1-methyl-2H-pyrimido(1,2-a)pyrimidine are preferred.

Of course, further additives G) can optionally be used. These may be, for example, additives customary in the area of coating technology, such as solvents, plasticizers, levelling agents or adhesion promoters. Plasticizers used are preferably liquids having good dissolution properties, low volatility and a high boiling point. It may also be advantageous simultaneously to use a plurality of additives of one type. Of course, it may also be advantageous to use a plurality of additives of a plurality of types.

With the polyurethane compositions according to the invention, holograms for optical applications in the entire visible range and in the near UV range (300-800 nm) can be produced by appropriate exposure processes. Visual holograms comprise all holograms which can be recorded by methods known to the person skilled in the art, including, inter alia, in-line (Gabor) holograms, off-axis holograms, full-aperture transfer holograms, whitelight transmission holograms ("rainbow holograms"), Denisyuk holograms, off-axis reflection holograms, edge-literature holograms and holographic stereograms; reflection holograms, Denisyuk holograms and transmission holograms are preferred. Optical elements, such as lenses, mirrors, deflection mirrors, filters, diffusion screens, diffraction elements, light guides, waveguides, projection screens and/or masks have are preferred. Frequently, these optical elements show frequency selectivity depending on how the holograms were exposed to light and which dimensions the hologram has. The polyurethane compositions described are particularly advantageous because, during their use, a high refractive index contrast delta $n \geq 0.011$ is achievable, which is not achieved with the formulations described in the prior art.

In addition, holographic images or diagrams can also be produced by means of the polyurethane compositions according to the invention, such as, for example, for personal portraits, biometric representations in security documents or generally of images or image structures for advertising, security labels, trademark protection, trademark branding, labels, design elements, decorations, illustrations, multi journey tickets, images and the like, and images which can represent digital data, inter alia also in combination with the products described above. Holographic images may give the impression of a three-dimensional image but they may also represent image sequences, short films or a number of different objects, depending on the angle from which they are illuminated, the light source (including moving light source) with which they are illuminated, etc. Owing to these varied design possibilities, holograms, in particular volume holograms, are an attractive solution for the abovementioned application.

The present invention therefore further relates to the use of the media according to the invention for recording visual holograms, for producing optical elements, images, diagrams, and a method for recording holograms using the polyurethane compositions according to the invention, and the media or holographic films obtainable therefrom.

The process according to the invention for the production of holographic media for recording visual holograms is preferably carried out in such a way that the synthesis components of the polyurethane compositions according to the invention, with the exception of component A), are homogeneously mixed with one another and component A) is admixed only immediately before application to the substrate or in the mould.

All methods and apparatuses known per se to the person skilled in the art from mixing technology, such as, for example, stirred tanks or both dynamic and static mixers, can be used for mixing. However, apparatuses without dead spaces or with only small dead spaces are preferred. Furthermore, preferred methods are those in which the mixing is effected within a very short time and with very thorough mixing of the two components to be mixed. In particular, dynamic mixers are suitable for this purpose, especially those in which the components come into contact with one another only in the mixer.

The temperatures during the procedure are 0 to 100° C., preferably 10 to 80° C., particularly preferably 20 to 60° C.

If necessary, degassing of the individual components or the entire mixture can also be carried out under reduced pressure of, for example, 1 mbar. Degassing, in particular after addition of component A), is preferred in order to prevent bubble formation by residual gasses in the media obtainable.

Prior to admixing of component A), the mixtures can be stored as a storage-stable intermediate, if required over several months.

After the admixing of component A) of the polyurethane compositions according to the invention, a clear, liquid formulation is obtained which, depending on composition, cures at room temperature within a few seconds to a few hours.

The ratio and the type and reactivity of the synthesis components of the polyurethane compositions is preferably adjusted so that the curing after admixing of component A) at room temperature begins within minutes to one hour. In a preferred embodiment, the curing is accelerated by heating after the admixing to temperatures between 30 and 180° C., preferably 40 to 120° C., particularly preferably 50 to 100° C.

The abovementioned adjustment with regard to the curing behaviour is easily possible easily in the form of routine experiments within the abovementioned quantity range of the components and the synthesis components available for selection in each case, in particular the preferred synthesis components.

Immediately after complete mixing of all components, the polyurethane compositions according to the invention have viscosities at 25° C. of typically 10 to 100 000 mPa·s, preferably 100 to 20 000 mPa·s, particularly preferably 200 to 10 000 mPa·s, especially preferably 500 to 5000 mPa·s, so that, even in solvent-free form, they have very good processing properties. In solution with suitable solvents, viscosities at 25° C. below 10 000 mPa·s, preferably below 2000 mPa·s, particularly preferably below 500 mPa·s, can be established.

Polyurethane compositions of the abovementioned type which cure in an amount of 15 g and with a catalyst content of 0.004% by weight at 25° C. in less than 4 hours or at a catalyst content of 0.02% in less than 10 minutes at 25° C. have proved to be advantageous.

For application to a substrate or into a mould, all respective customary methods known to the person skilled in the art are suitable, such as, in particular, knife coating, pouring, printing, screen printing, spraying or inkjet printing.

All the references described above are incorporated by reference in its entirety for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

EXAMPLES

The following examples are mentioned for explaining the photopolymers according to the invention but are not to be understood as being limiting. Unless noted otherwise, all stated percentages are percentages by weight.

Desmodur® XP 2410 is an experimental product of Bayer MaterialScience AG, Leverkusen, Germany, hexane diisocyanate-based polyisocyanate, proportion of iminooxadiazinedione at least 30%, NCO content: 23.5%

Desmodur® XP 2599 is an experimental product of Bayer MaterialScience AG, Leverkusen, Germany, full allophanate of hexane diisocyanate on Acclaim 4200, NCO content: 5.6-6.4%

Desmodur® XP 2580 is an experimental product of Bayer MaterialScience AG, Leverkusen, Germany, aliphatic polyisocyanate based on hexane diisocyanate, NCO content about 20%

Terathane® 650 is a commercial product of BASF AG, Ludwigshafen, Germany (poly-THF having molar masses of 650 g/mol).

Terathane® 1000 is a commercial product of BASF AG, Ludwigshafen, Germany (poly-THF having molar masses of 1000 g/mol).

Polyol 2 is a difunctional poly(ε-caprolactone)polyol (number average molar mass about 650 g/mol).

Polyol 1 is an experimental product of Bayer MaterialScience AG; the preparation is described below.

Polyols 3 to 5 are polyols according to the invention. Their preparation is described below.

DMC catalyst: double metal cyanide catalyst based on zinc hexacyanocobaltate (III), obtainable by the process described in EP-A 700 949

Fomrez® UL28: urethanization catalyst, dimethylbis[(1-oxoneodecl)oxy]stannane, commercial product of Momentive Performance Chemicals, Wilton, Conn., USA (used as 10% strength solution in N-ethylpyrrolidone).

CGI 909 is an experimental product sold in 2008 by Ciba Inc., Basle, Switzerland.

Irganox 1076 is octadecyl 3,5-di(tert)butyl-4-hydroxyhydrocinnamate (CAS 2082-79-3).

Figure 1:
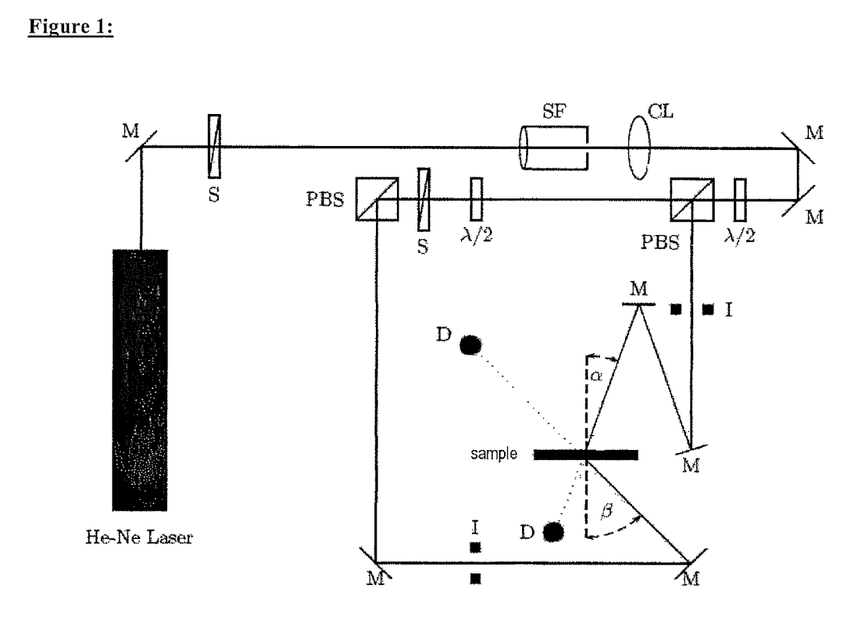
FIG. 1 depicts the geometry of a holographic media tester at λ=633 nm (He—Ne laser) for writing a reflection hologram.

Measurement of diffraction efficiency DE and refractive index contrast Δn:

The media according to the invention and comparative media produced in the experimental part were tested by means of a measuring arrangement according to FIG. 1 with regard to their holographic properties:

FIG. 1: Geometry of a holographic media tester at 2=633 nm (He—Ne laser) for writing a reflection hologram: M=mirror, S=shutter, SF=spatial filter, CL=collimator lens, λ/2=λ/2 plate, PBS=polarization-sensitive beam splitter, D=detector, I=iris diaphragm, α=21.8° and β=41.8° are the angles of incidence of the coherent beams measured outside the sample (the medium).

The beam of an He—Ne laser (emission wavelength 633 nm) was converted with the aid of the spatial filter (SF) and together with the collimation lens (CL) into a parallel homogeneous beam. The final cross sections of the signal and reference beam are established by the iris diaphragms (I). The diameter of the iris diaphragm opening is 4 mm The polarization-dependent beam splitters (PBS) split the laser beam into two coherent equally polarized beams. By the λ/2 plates, the power of the reference beam was adjusted of 0.5 mW and the power of the signal beam to 0.65 mW. The powers were determined using the semiconductor detectors (D) with sample removed. The angle of incidence (α) of the reference beam is 21.8° and the angle of incidence (β) of the signal beam is 41.8°. At the location of the sample (medium), the interference field of the two overlapping beams produced a grating of light and dark strips which are perpendicular to the angle bisectors of the two beams incident on the sample (reflection hologram). The strip spacing in the medium is ~225 nm (refractive index of the medium assumed to be ~1.49).

Holograms were written into the medium in the following manner:

Both shutters (S) are opened for the exposure time t. Thereafter, with shutters (S) closed, the medium was allowed a time of 5 minutes for diffusion of the still unpolymerized writing monomers. The holograms written were now read in the following manner. The shutter of the signal beam remained closed. The shutter of the reference beam was opened. The iris diaphragm of the reference beam was closed to a diameter of <1 mm. This ensured that the beam was always completely in the previously written hologram for all angles (Ω) of rotation of the medium. The turntable, under computer control, converted the angle range from Ω=0° to Ω=20° with an angle step width of 0.05°. At each angle approached, the powers of the beam transmitted in the zeroth order were measured by means of the corresponding detector D and the powers of the beam diffracted in the first order were measured by means of the detector D. The diffraction efficiency η was obtained at each angle Ω approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle Ω of rotation of the written hologram) was measured and was stored in a computer. In addition, the intensity transmitted in the zeroth order was also plotted against the angle Ω of rotation and stored in a computer.

The maximum diffraction efficiency (DE=$\eta_{max}$) of the hologram, i.e. its peak value, was determined. It may have been necessary for this purpose to change the position of the detector of the diffracted beam in order to determine this maximum value.

The refractive index contrast Δn and the thickness d of the photopolymer layer were now determined by means of the coupled wave theory (cf.: H. Kogelnik, The Bell System Technical Journal, Volume 48, November 1969, Number 9, page 2909 page 2947) from the measured Bragg curve and the variation of the transmitted intensity as a function of angle. The method is described below:

According to Kogelnik, the following is true for the Bragg curve η/(Ω) of a reflection hologram:

$$\eta = \frac{1}{1 + \frac{1 - (\chi/\Phi)^2}{\sinh^2(\sqrt{\Phi^2 - \chi^2})}}$$

with:

$$\Phi = \frac{\pi \cdot \Delta n \cdot d}{\lambda \cdot \sqrt{\cos(\alpha') \cdot \cos(\alpha' - 2\psi)}}$$

$$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

-continued $$n \cdot \sin(\alpha') = \sin(\alpha), n \cdot \sin(\beta') = \sin(\beta)$$

$$\Delta\theta = -\Delta\Omega \cdot \sqrt{\frac{1-\sin^2(\alpha)}{n^2 - \sin^2(\alpha)}}$$

Φ is the grating thickness, χ is the detuning parameter and Ψ is the angle of tilt of the refractive index grating which was written. α' and β' correspond to the angles α and β during writing of the hologram, but in the medium. ΔΘ is the angle detuning measured in the medium, i.e. the deviation from the angle α'. ΔΩ is the angle detuning measured outside the medium, i.e. the deviation from the angle α. n is the average refractive index of the photopolymer and was set at 1.504.

The maximum diffraction efficiency (DE=$\eta_{max}$) is then obtained for χ=0, i.e. ΔΩ=0, as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\psi)}}\right)$$

Figure 2:
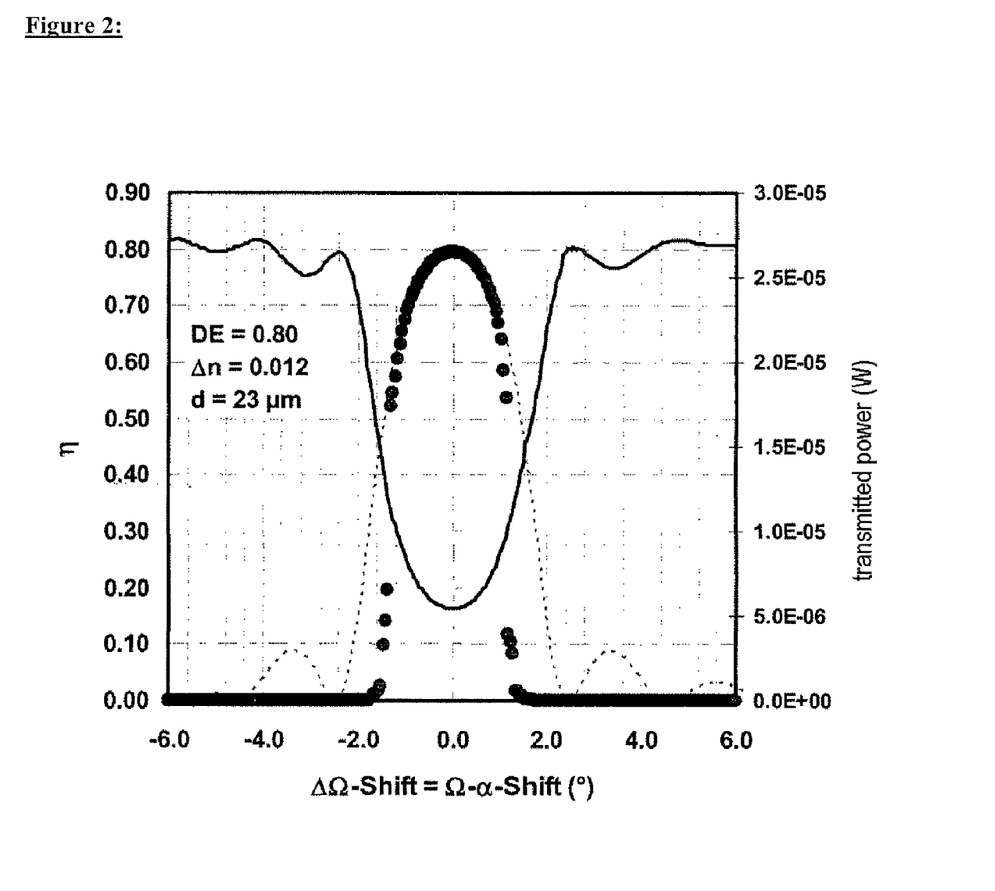
FIG. 2 depicts a plot of the Bragg curve η according to Kogelnik (dashed line), of the measured diffraction efficiency (solid circles) and of the transmitted power (black solid line) against the angle detuning ΔΩ.

The measured data of the diffraction efficiency, the theoretical Bragg curve and the transmitted intensity are shown in FIG. 2 plotted against the centred angle of rotation Ω-α shift. Since, owing to the geometric shrinkage and the change in the average refractive index during the photopolymerization, the angle at which DE is measured differs from α, the x axis is centred around this shift. The shift is typically 0° to 2°.

Since DE is known, the shape of the theoretical Bragg curve according to Kogelnik is determined only by the thickness d of the photopolymer layer. Δn is subsequently corrected via DE for a given thickness d so that measurement and theory of DE always agree. d is now adapted until the angle positions of the first secondary minima of the theoretical Bragg curve agree with the angle positions of the first secondary maxima of the transmitted intensity and additionally the full width at half maximum (FWHM) for the theoretical Bragg curve and the transmission intensity agree.

Since the direction in which a reflection hologram concomitantly rotates on reconstruction by means of an Ω scan, but the detector for the diffracted light can detect only a finite angle range, the Bragg curve of broad holograms (small d) is not completely detected in an Ω scan, but only the central region, with suitable detector positioning. That shape of the transmitted intensity which is complementary to the Bragg curve is therefore additionally used for adapting the layer thickness d.

FIG. 2: Plot of the Bragg curve η according to Kogelnik (dashed line), of the measured diffraction efficiency (solid circles) and of the transmitted power (black solid line) against the angle detuning ΔΩ. Since, owing to the geometric shrinkage and the change in the average refractive index during the photopolymerization, the angle at which DE is measured differs from α, the x axis is centred around this shift. The shift is typically 0° to 2°.

For a formulation, this procedure was possibly repeated several times for different exposure times t on different media in order to determine the energy dose of the incident laser beam at which DE reaches the saturation value during writing of the hologram. The average energy dose E is obtained as follows:

$$E(mJ/cm^2) = \frac{2 \cdot [0.50\ mW + 0.67\ mW] \cdot t(s)}{\pi \cdot 0.4^2\ cm^2}$$

The powers of the part-beams were adapted so that the same power density is achieved in the medium at the angles α and β used.

Preparation of Polyol 1

0.18 g of zinc octanoate, 374.8 g of ε-caprolactone and 374.8 g of a difunctional polytetrahydrofuran polyether polyol (equivalent weight 500 g/mol of OH) were initially introduced into a 1 l flask and heated to 120° C. and kept at this temperature until the solids content (proportion of non-volatile constituents) was 99.5% by weight or more. Thereafter, cooling was effected and the product was obtained as a waxy solid.

Preparation of Polyol 3

2465 g of Terathane® 650 were weighed into a 20 l reaction tank equipped with a stirrer and 450.5 mg of DMC catalyst were added. Heating was then effected to 105° C. with stirring at about 70 rpm. By application of a vacuum and pressure equilibration with nitrogen three times, air was exchanged for nitrogen. After the stirrer speed had been increased to 300 rpm, nitrogen was passed from below through the mixture for 72 minutes with the vacuum pump running and at a pressure of about 0.1 bar. Thereafter, a pressure of 0.3 bar was established by means of nitrogen and 242 g of propylene oxide (PO) were passed in for starting the polymerization. The pressure increased to 2.03 bar thereby. After 8 minutes, the pressure had fallen to 0.5 bar again and a further 12.538 kg of PO were metered in over a period of 2 h 11 min at 2.34 bar. 17 minutes after the end of the PO metering, a vacuum was applied at a residual pressure of 1.29 and complete degassing was effected. The product was stabilized by addition of 7.5 g of Irganox 1076 and obtained as a colourless, viscous liquid (OH number: 27.8 mg KOH/g, viscosity at 25° C.: 1165 mPa·s).

Preparation of Polyol 4

2475 g of Terathane® 650 were weighed into a 20 l reaction tank equipped with a stirrer and 452.6 mg of DMC catalyst were added. Heating was then effected to 105° C. with stirring at about 70 rpm. By applying a vacuum and equilibrating the pressure with nitrogen three times, air was exchanged for nitrogen. After the stirrer speed had been increased to 300 rpm, nitrogen was passed from below through the mixture for 57 minutes with the vacuum pump running and at a pressure of about 0.1 bar. Thereafter, a pressure of 0.5 bar was established by means of nitrogen and 100 g of ethylene oxide (EO) and 150 g of PO were passed in simultaneously for starting the polymerization. The pressure increased to 2.07 bar thereby. After 10 minutes, the pressure had fallen to 0.68 bar again and a further 5.116 kg of EO and 7.558 kg of PO as a mixture were passed in over a period of 1 h 53 min at 2.34 bar. 31 minutes after the end of the epoxide metering, a vacuum was applied at a residual pressure of 2.16 bar and complete degassing was effected. The product was stabilized by addition of 7.5 g Irganox 1076 and obtained as a slightly turbid (TE(F) number 330), viscous liquid (OH number 27.1 mg KOH/g, viscosity at 25° C.: 1636 mPa·s).

Preparation of Polyol 5

1707 g of a polycarbonate diol having a number average molar mass of 650 g/mol, prepared by polycondensation of (3-methyl)-1,5-pentanediol and diphenyl carbonate, were weighed into a 20 l reaction tank equipped with a stirrer and 527 mg of DMC catalyst were added. Heating to 130° C. was then effected with stirring at about 70 rpm. By application of a vacuum and equilibration of the pressure with nitrogen three times, air was exchanged for nitrogen. After the stirrer speed had been increased to 300 rpm, nitrogen was passed from below through the mixture for 85 minutes with the vacuum pump running and at a pressure of about 0.1 bar. Thereafter, a pressure of 0.2 bar was established by means of nitrogen and 174 g of PO were passed in for starting the polymerization. The pressure increased to 2.26 bar thereby. After 6 minutes, the pressure had fallen to 0.55 bar again and a further 8.826 kg of PO were passed in over a period of 1 h 32 min at 1.36 bar. 22 minutes after the end of the PO metering, a vacuum was applied at a residual pressure of 0.674 bar and complete degassing was effected. The product was stabilized by addition of 5.27 g of Irganox 1076 and obtained as a colourless, viscous liquid (OH number 24.8 mg KOH/g, viscosity at 25° C.: 1659 mPa·s).

Preparation of the Urethane Acrylate 1

0.1 g of 2,6-di-tert-butyl-4-methylphenol, 0.05 g of dibutyltin dilaurate (Desmorapid Z, Bayer MaterialScience AG, Leverkusen, Germany) and 213.07 g of a 27% strength solution of tris(p-isocyanatophenyl)thiophosphate in ethyl acetate (Desmodur® RFE, product of Bayer MaterialScience AG, Leverkusen, Germany) were initially introduced into a 500 ml round-bottomed flask and heated to 60° C. Thereafter, 42.37 g of 2-hydroxyethyl acrylate were added dropwise and the mixture was still kept at 60° C. until the isocyanate content had fallen below 0.1%. Thereafter, cooling was effected and the ethyl acetate was completely removed in vacuo. The product was obtained as a semicrystalline solid.

For the production of the holographic media, the component C, the component D (which can already be predissolved in the component C) and optionally the component G are dissolved in the component B, if required at 60° C., after which 20 μm glass beads (e.g. from Whitehouse Scientific Ltd, Waverton, Chester, CH3 7PB, United Kingdom) are added and thoroughly mixed. Thereafter, the component E in pure form or in dilute solution in NEP is weighed in in the dark or under suitable lighting and mixed again for 1 minute. Heating is optionally effected to 60° C. in a drying oven for not more than 10 minutes. Component A is then added and mixing is effected again for 1 minute. Subsequently, a solution of the component F is added and mixing is effected again for 1 minute. The mixture obtained is degassed with stirring at <1 mbar for not more than 30 seconds, after which it is distributed over 50×75 mm glass plates and these are each covered with a further glass plate. The curing of the PU formulation takes place under weights of 15 kg over several hours (usually overnight). In some cases, the media are post-cured in light-tight packaging for a further 2 hours at 60° C. The thickness d of the photopolymer layer is 20 μm, resulting from the diameter of the glass spheres used. Since different formulations having different starting viscosity and different curing rate of the matrix lead to layer thicknesses d of the photopolymer layer which are not always the same, d is determined separately from the characteristics of the written holograms for each sample.

Comparative Example 1 (Medium)

8.89 g of the polyol 1 prepared as described above (comparison for component B) were mixed with 3.75 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 1.647 g of Desmodur® XP 2410 (component A) were added and mixing was effected again. Finally, 0.009 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0101.

Comparative Example 2 (Medium)

6.117 g of polyol 2 (comparison for component B) were mixed with 3.75 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 4.418 g of Baytec® WE 180 (component A) were added and mixing was effected again. Finally, 0.030 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0063.

Comparative Example 3 (Medium)

7.342 g of Terathane 1000 (comparison for component B) were mixed with 3.75 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 3.193 g of Desmodur® XP 2580 (component A) were added and mixing was effected again. Finally, 0.030 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0106.

Comparative Example 4 (Medium)

1.129 g of polyether L800 (polypropylene oxide having a number average molar mass of 200 g/mol) (comparison for component B) were mixed with 3.081 g of urethane acrylate 1 (component C), 0.12 g of CGI 909 and 0.012 g of new methylene blue (together component E) at 60° C. and 0.431 g of N-ethylpyrrolidone (component G) so that a clear solution was obtained. Thereafter, cooling to 30° C. was effected, 7.525 g of Desmodur® XP 2599 (component A) were added and mixing was effected again. Finally, 0.0259 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0096.

Example 1 (Medium)

8.293 g of polyol 3 (component B) were mixed with 5.25 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 0.743 g of Desmodur® XP 2410 (component A) was added and mixing was effected again. Finally, 0.0140 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0196.

Example 2 (Medium)

7.711 g of polyol 3 (component B) were mixed with 3.75 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 2.823 g of Desmodur® XP 2599 (component A) were added and mixing was effected again. Finally, 0.0389 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0125.

Example 3 (Medium)

8.827 g of polyol 3 (component B) were mixed with 4.5 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 0.958 g of Desmodur® XP 2580 (component A) was added and mixing was effected again. Finally, 0.0255 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0206.

Example 4 (Medium)

9.533 g of polyol 4 (component B) were mixed with 3.75 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 1.001 g of Desmodur® XP 2580 (component A) were added and mixing was effected again. Finally, 0.0342 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0182.

Example 5 (Medium)

9.611 g of polyol 5 (component B) were mixed with 3.75 g of urethane acrylate 1 (component C), 0.15 g of CGI 909 and 0.015 g of new methylene blue (together component E) at 60° C. and 0.525 g of N-ethylpyrrolidone (component G) so that a clear solution was obtained. Thereafter, cooling to 30° C. was effected, 0.924 g of Desmodur® XP 2580 (component A) was added and mixing was effected again. Finally, 0.0300 g of Fomrez® UL 28 (component F) was added and mixing was effected briefly again. The liquid material obtained was then poured onto a glass plate and covered there with a second glass plate which was kept at a distance of 20 μm by spacers. This test specimen was left at room temperature and cured over 16 hours. Maximum Δn: 0.0185.

The invention claimed is:

1. A polyurethane composition comprising
    A) a polyisocyanate component;
    B) an isocyanate-reactive component comprising a hydroxy-functional multiblock copolymer B1) of the type $Y(X_i-H)_n$ having a number average molecular weight of greater than 1000 g/mol; wherein
    $X_i$ is an oxyalkylene units of formula (I):

$$-CH_2-CH(R)-O- \qquad (I);$$

i is an integer from 1 to 10;
    n is an integer from 2 to 8;
    R is a hydrogen, alkyl, or aryl radical, wherein said alkyl or aryl radical is optionally substituted or interrupted by a heteroatom; and
    Y is the fundamental initiator and the proportion of the segments $X_i$, based on the total amount of the segments $X_i$ and Y, accounts for at least 50% by weight;
    C) free-radically polymerizable compound free of NCO groups;
    D) free radical stabilizers;
    E) photoinitiators;
    F) optionally catalysts; and
    G) optionally auxiliaries and additives.

2. The polyurethane composition of claim 1, wherein A) comprises a polyisocyanate and/or a prepolymer based on HDI, TMDI, and/or TIN.

3. The polyurethane composition of claim 1, wherein A) comprises a polyisocyanate based on HDI with isocyanurate and/or iminooxadiazinedione structures or prepolymers having an NCO functionality of from 2 to 5 and exclusively primary NCO groups.

4. The polyurethane composition of claim 1, wherein A) has a residual content of free monomeric isocyanate of less than 0.5% by weight.

5. The polyurethane composition of claim 1, wherein at least one segment $X_i$ is a propylene oxide-based homopolymer or random or block copolymer comprising oxyethylene, oxypropylene and/or oxybutylene units, wherein the proportion of said oxypropylene units, based on the total amount of all oxyethylene, oxypropylene, and oxybutylene units, accounts for at least 20% by weight.

6. The polyurethane composition of claim 1, wherein said starter segment Y is based on a difunctional, aliphatic polycarbonate polyol, poly(ε-caprolactone), or polymer of tetrahydrofuran having a number average molar mass greater than 250 g/mol and less than 2100 g/mol.

7. The polyurethane composition of claim 1, wherein said multiblock copolymers B1) has a number average molecular weight of from 1200 to 12 000 g/mol.

8. The polyurethane composition of claim 1, wherein said compound of C) has a refractive index $n_D^{20}$ of greater than 1.55.

9. The polyurethane composition of claim 1, wherein C) comprises a urethane acrylate and/or a urethane methacrylate based on an aromatic isocyanate and 2-hydroxyethyl acrylate, hydroxypropyl acrylate, 4-hydroxybutyl acrylate, polyethylene oxide mono(meth)acrylate, polypropylene oxide mono (meth)acrylate, polyalkylene oxide mono(meth)acrylate, and/or a poly(ε-caprolactone) mono(meth)acrylate.

10. A process for producing media for recording visual holograms comprising (1) applying the polyurethane composition of claim 1 to a substrate or in a mould and (2) curing said polyurethane composition.

11. A medium for recording visual holograms produced by the process of claim 10.

12. An optical element or image comprising the medium of claim 11.

13. A method for recording a hologram comprising exposing the medium of claim 12.

* * * * *